(12) United States Patent
Shih

(10) Patent No.: US 11,094,662 B1
(45) Date of Patent: Aug. 17, 2021

(54) SEMICONDUCTOR ASSEMBLY AND METHOD OF MANUFACTURING THE SAME

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/780,433

(22) Filed: Feb. 3, 2020

(51) Int. Cl.
| | |
|---|---|
| H01L 23/00 | (2006.01) |
| H01L 23/528 | (2006.01) |
| H01L 23/522 | (2006.01) |
| H01L 21/768 | (2006.01) |
| H01L 25/065 | (2006.01) |

(52) U.S. Cl.
CPC ........ *H01L 24/29* (2013.01); *H01L 21/76816* (2013.01); *H01L 21/76832* (2013.01); *H01L 21/76877* (2013.01); *H01L 23/5226* (2013.01); *H01L 23/5283* (2013.01); *H01L 24/83* (2013.01); *H01L 25/0657* (2013.01)

(58) Field of Classification Search
CPC ................. H01L 24/29; H01L 23/5226; H01L 21/76816; H01L 21/76832; H01L 21/76877; H01L 23/5283; H01L 24/83; H01L 25/0657
See application file for complete search history.

(56) References Cited

U.S. PATENT DOCUMENTS

| | | | |
|---|---|---|---|
| 10,854,530 B1 * | 12/2020 | Cheng | ................ H01L 25/0657 |
| 2014/0361347 A1 | 12/2014 | Kao et al. | |
| 2018/0040547 A1 | 2/2018 | Zuo et al. | |
| 2019/0123092 A1 | 4/2019 | Lin et al. | |

FOREIGN PATENT DOCUMENTS

| | | |
|---|---|---|
| EP | 2317558 B1 | 6/2020 |
| TW | 201344890 A | 11/2013 |
| WO | WO 2017074390 A1 | 5/2017 |

* cited by examiner

*Primary Examiner* — Karen Kusumakar
(74) *Attorney, Agent, or Firm* — Muncy, Geissler, Olds & Lowe, P.C.

(57) ABSTRACT

The present disclosure provides a semiconductor assembly. The semiconductor assembly includes a first device, a second device, and an interconnect structure configured to electrically coupled the first device and the second device. The second device is stacked on the first device. The interconnect structure includes a first leg, a second leg, and a cross member connecting the first leg to the second leg, wherein the first leg penetrates through the cap dielectric layer and the second device and contacts a first conductive feature of the first device, and a second leg penetrates through the cap dielectric layer and contacts a second conductive feature of the second device.

7 Claims, 15 Drawing Sheets

SEMICONDUCTOR ASSEMBLY AND METHOD OF MANUFACTURING THE SAME

TECHNICAL FIELD

The present disclosure relates to a semiconductor assembly and a method of manufacturing the same, and more particularly, to a semiconductor assembly with three dimensional (3D) integration and a method of manufacturing the same.

DISCUSSION OF THE BACKGROUND

As integrated circuit technologies continue to advance, ongoing efforts seek to increase performance and density, improve form factor, and reduce costs. One approach explored by designers to realize such benefits is the implementation of stacked three-dimensional (3D) integrated circuits. Some areas where 3D integrated circuits are a suitable consideration include stacking of two or more chips that are fabricated using different fabrication processes, or stacking of chips that are fabricated using the same fabrication processes to reduce the footprint of the integrated circuit apparatus.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor assembly. The semiconductor assembly includes a first device, a second device, a cap dielectric layer and an interconnect structure. The second device is stacked on the first device and the cap dielectric layer is disposed on the second device. The interconnect structure includes a first leg penetrating through the cap dielectric layer and the second device and contacting a first conductive feature of the first device, a second leg penetrating through the cap dielectric layer and contacting a second conductive feature of the second device, and a cross member connecting the first leg to the second leg.

In some embodiments, the semiconductor assembly further includes a bonding layer between the first device and the second device and surrounding the first leg.

In some embodiments, the bonding layer contacts the first conductive feature and the second conductive feature.

In some embodiments, the first device and the second device are arranged in a front-to-front configuration.

In some embodiments, the cross member is buried in the cap insulating layer.

Another aspect of the present disclosure provides a method of manufacturing a semiconductor assembly. The method includes steps of providing a first device and forming a first bonding layer on the first device; providing a second device and forming a second bonding layer on the second device; stacking the second device on the first device such that the second device contacts the first bonding layer and the second bonding layer; fusing the first bonding layer and the second bonding layer; depositing a cap dielectric layer on the second device; and forming an interconnect structure to electrically connect the second device to the first device.

In some embodiments, the forming of the interconnect structure includes steps of forming a first trench through the cap dielectric layer, the second device, the second bonding layer and the first bonding layer to expose a first conductive feature of the first device; forming a second trench on the second device to expose a second conductive feature of the second device simultaneously with the forming of the first trench; and depositing a conductive material in the first trench and the second trench.

In some embodiments, the first bonding layer contacts the first conductive feature, and the second bonding layer contacts the second conductive feature.

In some embodiments, a portion of the cap dielectric layer between the first trench and the second trench is removed simultaneously with the forming of the first trench and the second trench, and conductive material is further deposited on the cap dielectric layer between the first trench and the second trench.

In some embodiments, the formation of the first trench and the second trench includes steps of forming a first layer structure on the cap dielectric layer, wherein the first layer structure comprises a plurality of first openings to expose portions of the cap dielectric layer; forming a second layer structure to cover portions of the first layer structure, wherein the first openings are exposed through the second layer structure; performing an etching process to form the first trench and the second trench; and removing the portions of the cap dielectric layer through portions of the first layer structure not covered by the second layer structure.

In some embodiments, the first device includes a first substrate, a first main component on the first substrate, a first insulating layer covering the first substrate and encapsulating the first main component, a first conductive plug in the first insulating layer and connecting the first main component to a first conductive feature, and a first ILD layer surrounding the first conductive feature; the second device includes a second substrate, a second main component on the second substrate, a second insulating layer covering the second substrate and encapsulating the second main component, a second conductive plug in the second insulating layer and connecting the second main component to the second conductive feature, a second ILD layer surrounding the second conductive feature, and the cap dielectric layer contacting the second substrate, wherein the first trench penetrates through the second substrate, the second insulating layer and the second ILD layer, and the second trench penetrates through the second substrate and the second insulating layer.

In some embodiments, the first conductive feature includes a plurality of first horizontal members and a plurality of first vertical members alternately stacked, wherein the first horizontal members farthest from the first substrate contact the first bonding layer, and the second conductive feature includes a plurality of second horizontal members and a plurality of second vertical members alternately stacked, wherein the second horizontal members farthest from the second substrate contact the second bonding layer.

In some embodiments, the method further includes a step of thinning the second device before the deposition of the cap dielectric layer.

In some embodiments, an anneal process is performed to fuse the first bonding layer and the second bonding layer so as to strengthen the bond between the first bonding layer and the second layer.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1A:
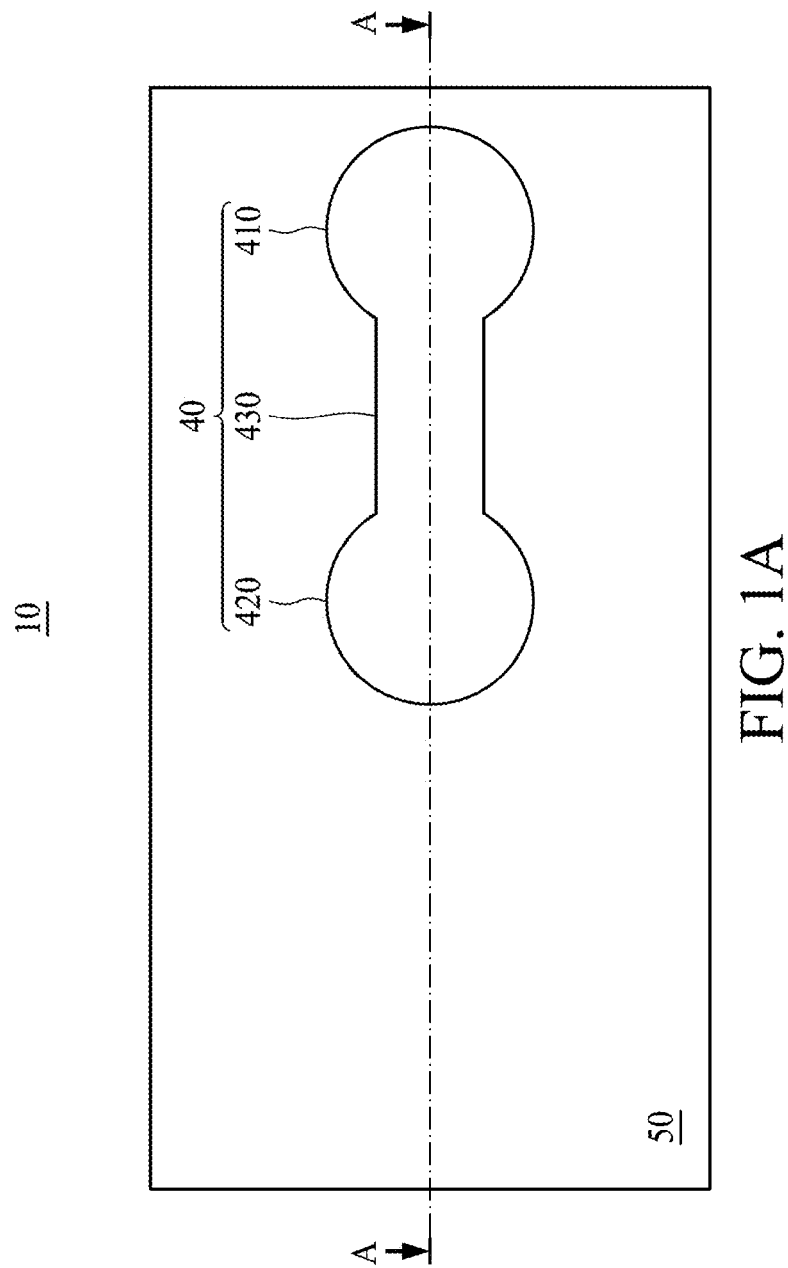
FIG. 1A is a top view of a semiconductor assembly in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 1B:
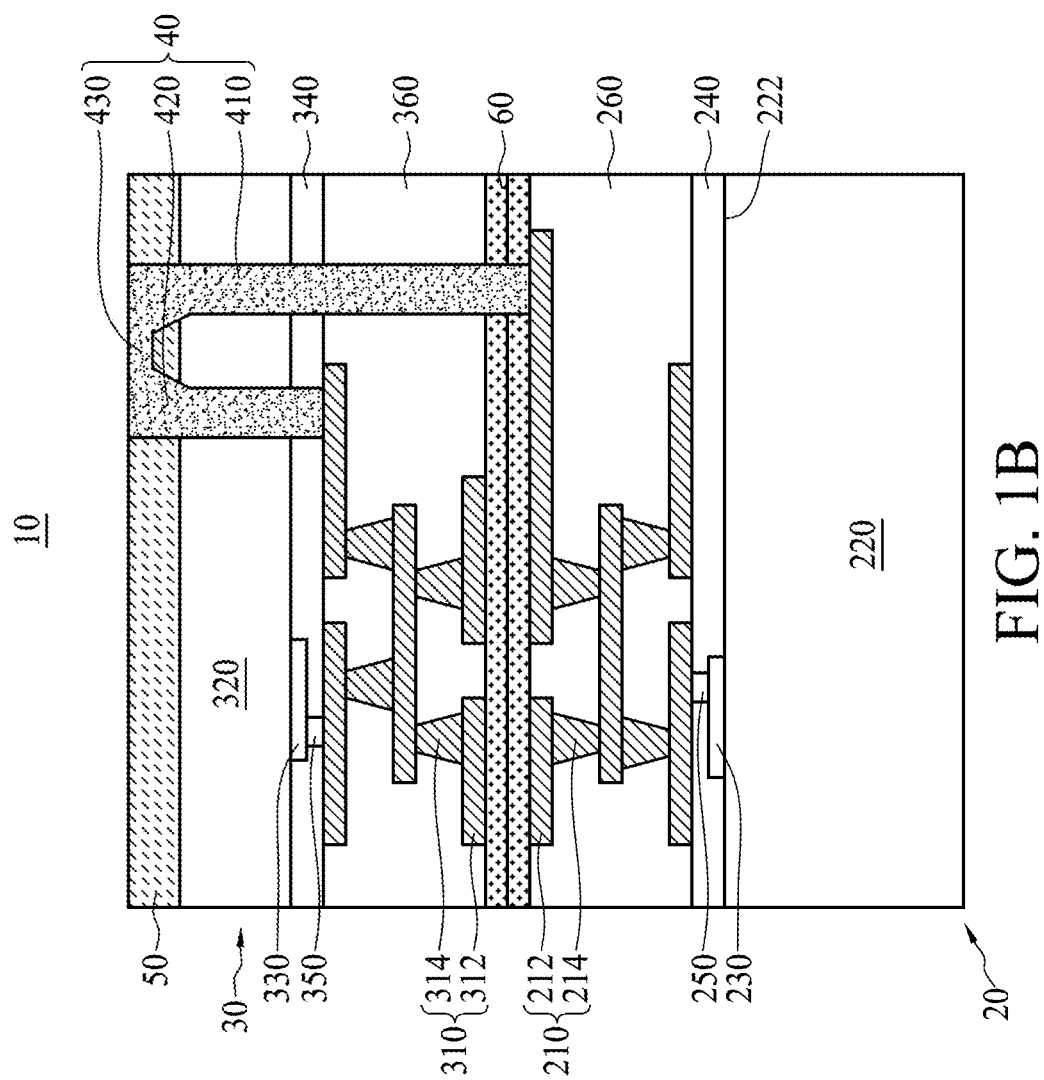
FIG. 1B is a cross-sectional view taken along line A-A in FIG. 1A.

FIG. 1A is a top view of a semiconductor assembly 10 in accordance with some embodiments of the present disclosure, and FIG. 1B is a cross-sectional view taken along line A-A in FIG. 1A. Referring to FIGS. 1A and 1B, the semiconductor assembly 10 includes a first device 20, a second device 30 stacked on and bonded to the first device 20, and an interconnect structure 40 contacting the first device 20 and the second device 30. Specifically, the interconnect structure 40 includes a first leg 410 penetrating through the second device 30 and contacting a first conductive feature 210 of the first device 20, a second leg 420 penetrating a second substrate 320 and a second insulating layer 340 of the second device 30 and contacting a second conductive feature 310 of the second device 30, and a cross member 430 connecting the first leg 410 to the second leg 420. As shown in FIG. 1B, the second leg 420 is parallel to the first leg 410, and the cross member 430 contacts top ends of the first leg 410 and the second leg 420.

As shown in FIG. 1A, the first leg 410 and the second leg 420 are substantially circular in shape, and the cross member 430, between the first leg 410 and the second leg 420, is substantially rectangular in shape in some embodiments. In alternative embodiments, the first leg 410 and the second leg 420 may be substantially rectangular or polygonal in shape when viewed in a plan view.

Referring to FIG. 1B, in some embodiments, the semiconductor assembly 10 further includes a cap dielectric layer 50 disposed on the second device 30, and portions of the first leg 410, the second leg 420 and the cross member 430 are surrounded by the cap dielectric layer 50. In some embodiments, a portion of the cap dielectric layer 50 is disposed beneath the cross member 410. In some embodiments, the cap dielectric layer 50 may be a deposited oxide-containing dielectric layer.

Still referring to FIG. 1B, the first device 20 and the second device 30 are vertically stacked in a front-to-front configuration, and a bonding layer 60 including insulating material is sandwiched between the first device 20 and the second device 30, wherein the first leg 410 penetrates through the bonding layer 60 and contacts the first conductive feature 210. In some embodiments, the bonding layer 60 contains dielectric material that may be used to prevent shorting between the first conductive feature 210 and the second conductive feature 310.

In some embodiments, the first device 20 and the second device 30 may be fabricated using the same fabrication process. For example, the first device 20 and the second device 30 may form a memory stack. In alternative embodiments, the first device 20 and the second device 30 may be fabricated using different fabrication processes. For example, one of the first device 20 and the second device 30 may be a memory device and the other of the first device 20 and the second device 30 may be a processor, an image sensor or an application-specific integrated circuit (ASIC) device.

The first device 20 further includes a first substrate 220, one or more first main components 230 on the first substrate 220, a first insulating layer 240 covering a front surface 222 of the first substrate 220 and encapsulating the first main components 230, and one or more first conductive plugs 250 formed in the first insulating layer 240 to electrically connect the first main components 230.

The first substrate 220 may be made of silicon or other semiconductor elementary materials such as germanium. The first main components 230 can include transistors, capacitors, resistors, diodes, fuses and the like formed in a front-end-of-line (FEOL) process. In some embodiments, the first main components 230 can also include doped regions and isolation structures in the first substrate 220, wherein the isolation structures, such as shallow trench isolation (STI) structures, are used to separate the first main components 230 from each other and are fabricated by etching the first substrate 220 to form trenches and filling the trenches with one or more dielectric materials.

The first conductive plugs 250 are made of materials including copper, copper alloy, aluminum, aluminum alloy, other conductive materials or a combination thereof. The first conductive feature 210, physically connected to the first conductive plug 250, is also made of conductive materials, such as tungsten, copper, aluminum, gold, titanium or a combination thereof. In some embodiments, the first conductive feature 210 and the first conductive plug 250 are formed in a back-end-of-line (BEOL) process and made of conductive materials that are heat resistant. As shown in FIG. 1B, the first conductive feature 210 includes a plurality of first horizontal members 212 alternately stacked with a plurality of first vertical members 214, wherein the bottommost first horizontal member 212 contacts the first conductive plugs 250, and the bonding layer 60 covers a majority portion of the topmost first horizontal member 212.

The first substrate 20 further includes a first inter-layer dielectric (ILD) layer 260 between the insulating layer 240 and the bonding layer 60 and surrounding the first conductive feature 210. In some embodiments, the first ILD layer 260 can contain one or more dielectric layers, in which the material thereof can be the same or different from that of the first insulating layer 240 and the bonding layer 60. Therefore, the first ILD layer 260 has an etching selectivity with respect to the first insulating layer 240. In some embodiments, the method of forming the first insulating layer 240 and the first ILD layer 260 can include a chemical vapor deposition (CVD) process, a spin coating process, or other suitable process that can form dielectric materials.

The second device 30, arranged upside down, includes the second substrate 320 and one or more second main components 330 on the second substrate 320, the second insulating layer 340 covering the second substrate 320 and encapsulating the second main components 330, and one or more second conductive plugs 350 penetrating through the second insulating layer 340 to electrically connect the second main components 330. The second conductive feature 310, contacting the second conductive plugs 350, includes a plurality of second horizontal members 312 alternately stacked with a plurality of second vertical members 314. The second horizontal members 312 farthest from the second substrate 320 contact the bonding layer 60. At least one second horizontal member 312 closest to the second substrate 320 is physically connected to the second conductive plug 350. The second device 30 further includes a second ILD layer 360 between the bonding layer 60 and the second insulating layer 340 and surrounding the second conductive feature 310.

In some embodiments, the materials and formation methods of the second conductive feature 310, the second insulating layer 340, the second conductive plug 350 and the second ILD layer 360 are essentially the same as those of the first conductive feature 210, the first insulating layer 240, the first conductive plug 250 and the first ILD layer 260, and repeated description of those layers is omitted for brevity.

Figure 2:
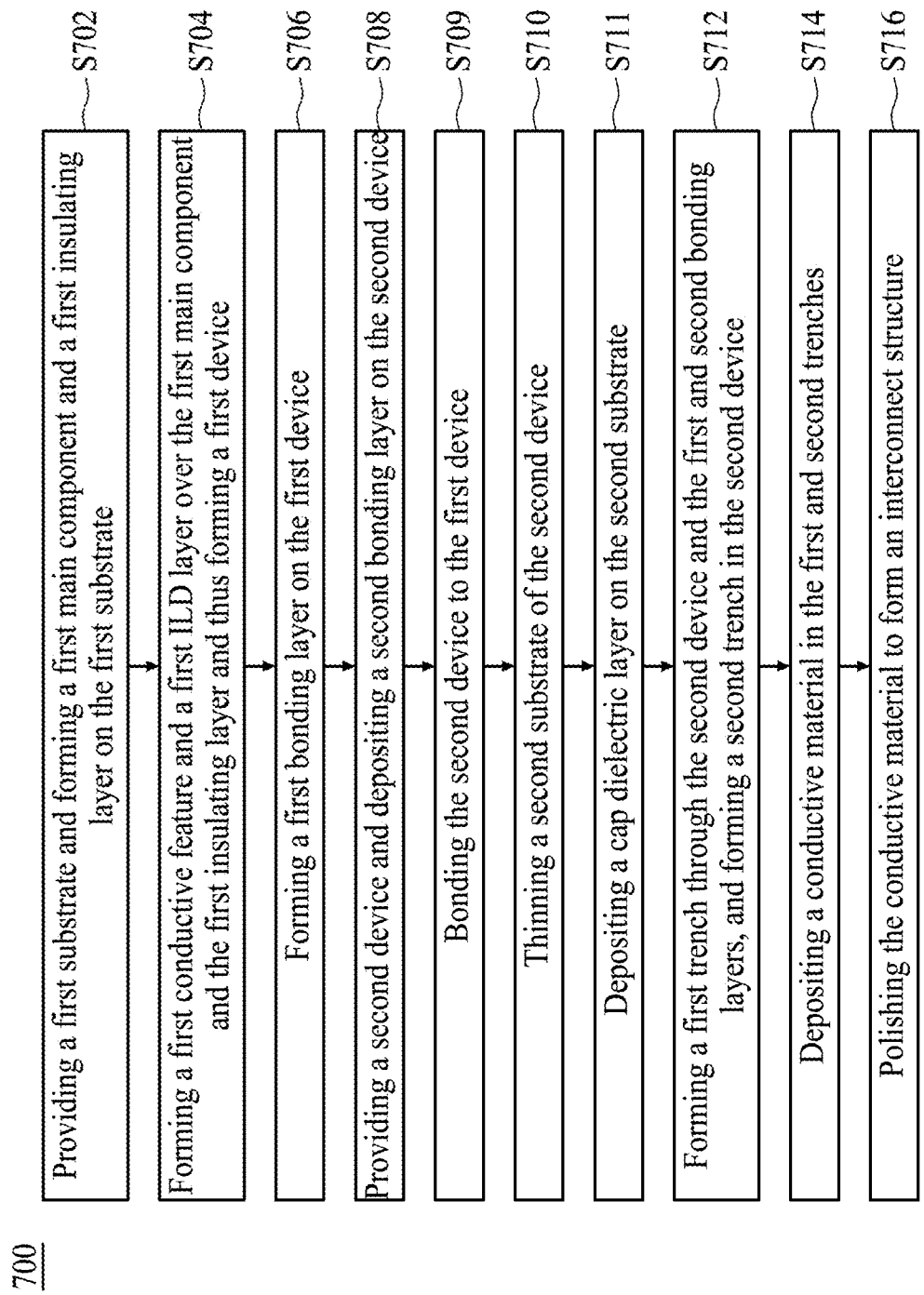
FIG. 2 is a flow diagram illustrating a method of manufacturing a semiconductor assembly in accordance with some embodiments of the present disclosure.

FIG. 2 is a flow diagram illustrating a method 700 of manufacturing a semiconductor assembly 10 in accordance with some embodiments of the present disclosure. FIGS. 3 to 13 are schematic diagrams illustrating various fabrication stages constructed according to the method 700 for manufacturing the semiconductor assembly 10 in accordance with some embodiments of the present disclosure. The stages shown in FIGS. 3 to 13 are also illustrated schematically in the flow diagram in FIG. 2. In the subsequent discussion, the fabrication stages shown in FIGS. 3 to 13 are discussed in reference to the process steps shown in FIG. 2.

Figure 3:
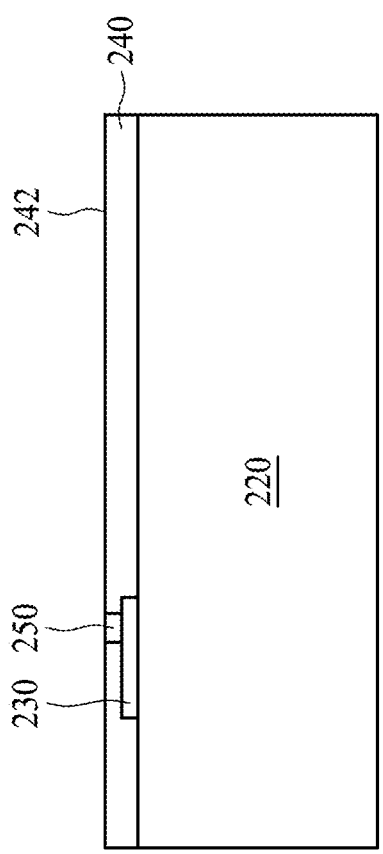
FIGS. 3 through 9 are cross-sectional views of intermediate stages in the formation of a semiconductor assembly in accordance with some embodiments of the present disclosure.

Referring to FIG. 3, a first substrate 220 is provided and at least one first main component 230 and a first insulating layer 240 are formed on the first substrate 220 according to a step S702 in FIG. 2. The first substrate 220 may include silicon (Si), silicon germanium (SiGe), gallium arsenide (GaAs), or other suitable semiconductor material. In some embodiments, various well regions (not shown) may be formed in the first substrate 220 and may be configured to form the first main component 230. The well regions may be neutral, or n-type or p-type doped regions, depending on the conductivity type of the first main component 230.

The first insulating layer 240 is deposited on the first substrate 220 and encapsulates the first main component 230. After the deposition of the first insulating layer 240, a planarization process may be performed to provide the first insulating layer 240 with a substantially planar first top surface 242.

Next, a first conductive plug 250 is formed in the first insulating layer 240 so as to contact the first main component 230. In some embodiments, the fabrication of the first conductive plug 250 involves sequentially patterning the first insulating layer 240 using lithography and etching processes to form a contact hole (not shown) to expose a portion of the first main component 230, and filling a first conductive material in the contact hole. In some embodiments, the filling of the contact hole may include a plating process. In some embodiments, after performing the plating process, the first conductive material may overflow the contact hole and cover the top surface 242 of the insulating layer 240; accordingly, an additional planarization may be performed to remove the overflow portion of the first conductive material.

Figure 4:
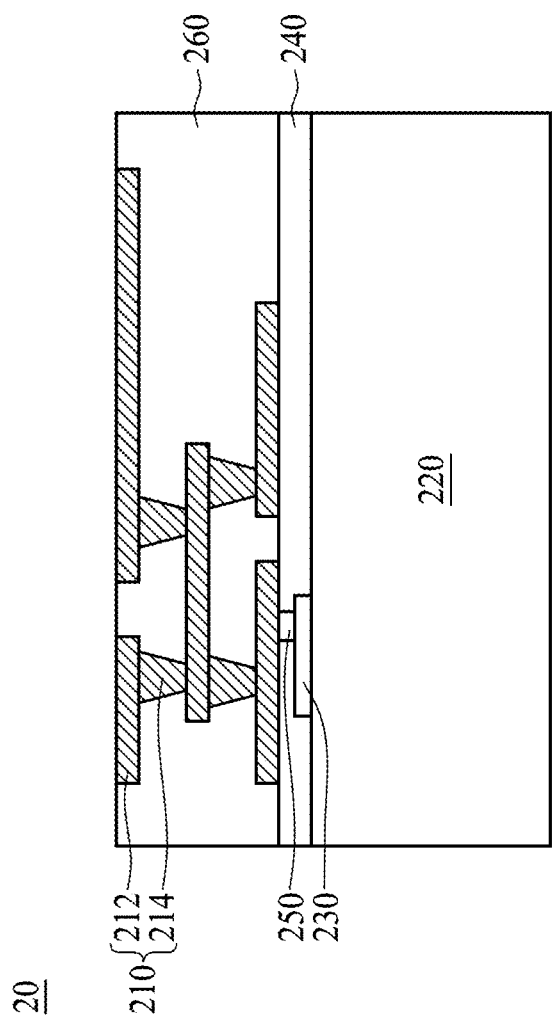

Referring to FIG. 4, in some embodiments, a first conductive feature 210 and a first ILD layer 260 are formed over the first insulating layer 240 and the first conductive plug 250 according to a step S704 in FIG. 2. Accordingly, a first device 20 is formed. The first conductive feature 210 embedded in the first ILD layer 260 includes a plurality of first horizontal members 212 alternately stacked with a plurality of first vertical members 214. In some embodiments, surfaces of the topmost first horizontal members 212, farthest from the first substrate 220, are exposed through the first ILD layer 260, for contacting an interconnect structure, as described below. In some embodiments, the first conductive feature 210 may be formed using the well-known damascene processes. In some embodiments, the first ILD layer 260 includes silicon oxide, silicon nitride, oxynitride, borosilicate glass (BSG), low-k material, another suitable material or a combination thereof. In some embodiments, the formation of the first ILD layer 260 includes performing one or more processes by CVD or spin coating.

Figure 5:
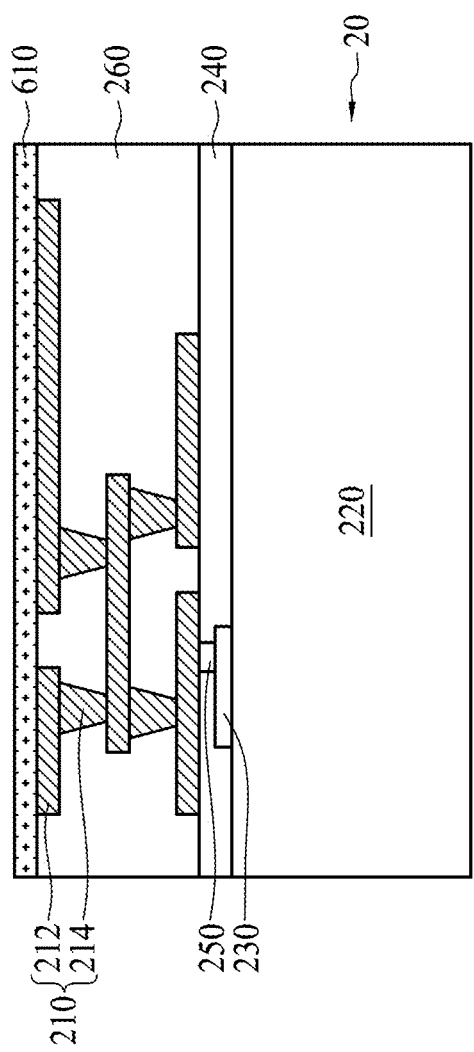

Referring to FIG. 5, in some embodiments, a first bonding layer 610 is formed on the first device 20 according to a step S706 in FIG. 2. The first bonding layer 610, which may be used as a bonding interface in dielectric bonding, fully covers the first conductive feature 210 and the first ILD layer 260. In some embodiments, the first bonding layer 610 is a dielectric film including silicon-containing dielectric, such as silicon oxide or silicon dioxide. The first bonding layer 610 is formed using a plasma-enhanced CVD process or a spin coating process.

Figure 6:
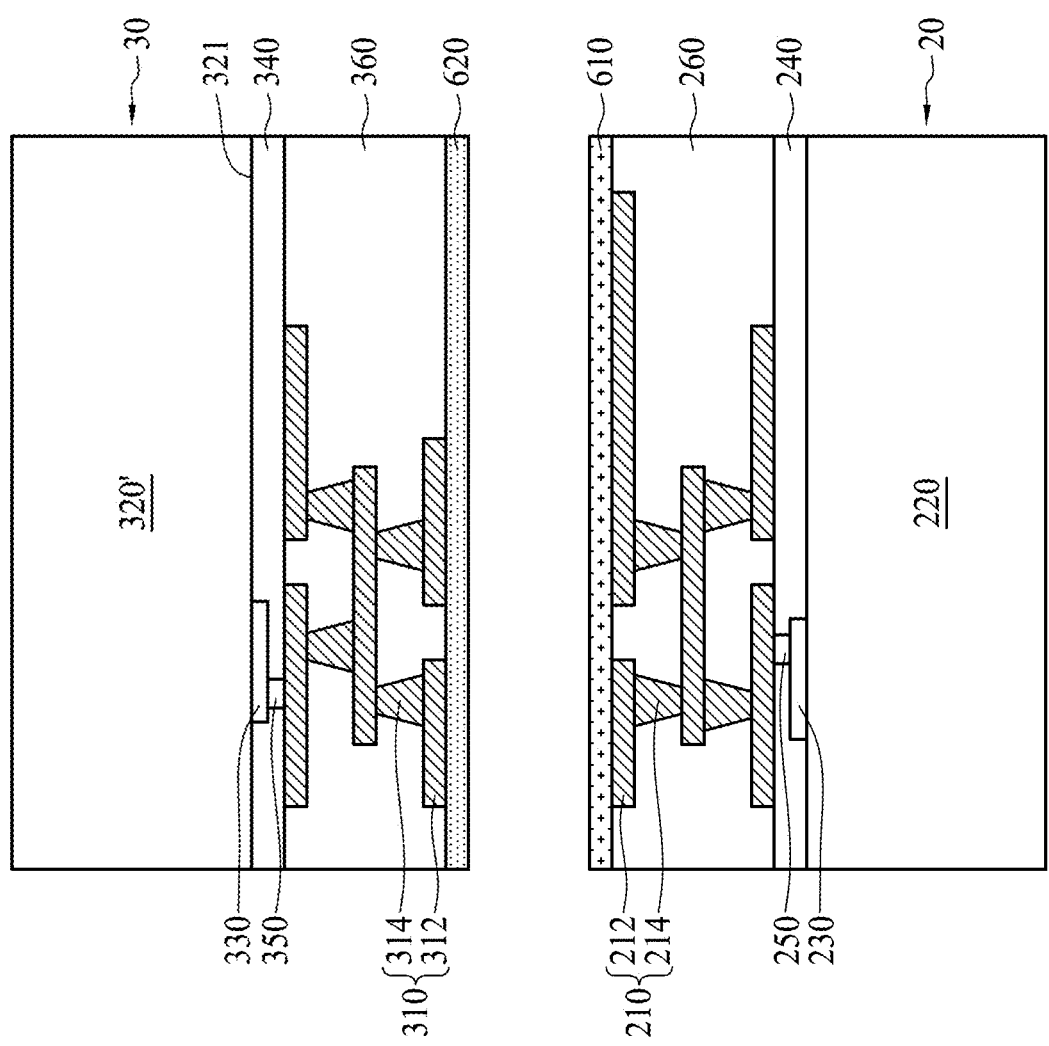

Referring to FIG. 6, in some embodiments, a second device 30 is provided and a second bonding layer 620 is deposited on the second device 30 according to a step S708 in FIG. 2. In FIG. 6, the second device 30 is arranged upside down and aligned with the first device 20, such that the second bonding layer 620 faces the first bonding layer 610.

As shown in FIG. 6, the second device 30 includes a second substrate 320', a second main component 330 on a front surface 321 of the second substrate 320', a second insulating layer 340 covering the front surface 321 and encapsulating the second main component 330, and a second conductive plug 350 formed in the second insulating layer 340 and contacting the second main component 330. The second device 30 further includes a second conductive feature 310 formed on the second insulating layer 340, wherein the second conductive feature 310 includes a plurality of second horizontal members 312 and a plurality of second vertical members 314 alternately stacked. A second ILD layer 360 is formed between the second insulating layer 340 and the second bonding layer 620 and surrounds the second conductive feature 310.

The second bonding layer 620, which is used as a bonding interface in dielectric bonding, fully covers the second ILD layer 360 and the second horizontal members 312 exposed through the second ILD layer 360. In some embodiments, the materials and formation methods of the second bonding layer 620 are essentially the same as those of the first bonding layer 610, so that the second device 30 can be bonded to the first device 20 by using an oxide fusion bonding process.

Figure 7:
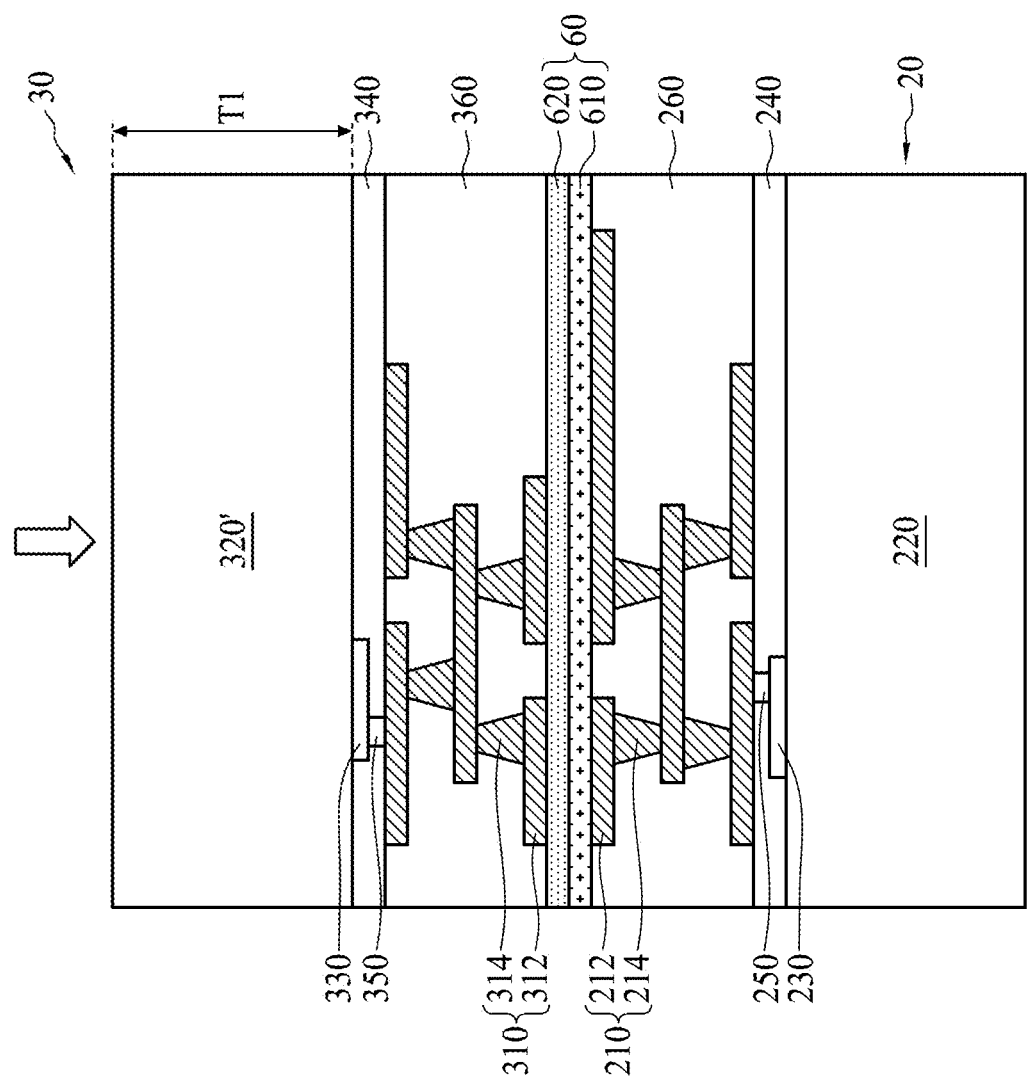

Referring to FIG. 7, in some embodiments, the second device 30 is bonded to the first device 20 according to a step S709 in FIG. 2. After the first device 20 and the second device 30 are aligned, the first bonding layer 610 and the second bonding layer 620 are brought into contact to begin a dielectric-to-dielectric bonding process. An anneal process is then performed to fuse the first bonding layer 610 and the second bonding layer 620 so as to strengthen the bond between the first bonding layer 610 and the second layer 620, and a bonding layer 60 is thus formed. As shown in FIG. 7, the second substrate 320' has a thickness T1, which is about 775 micrometers. In some embodiments, the first substrate 220 may have a thickness similar to that of the second substrate 320'.

Figure 8:
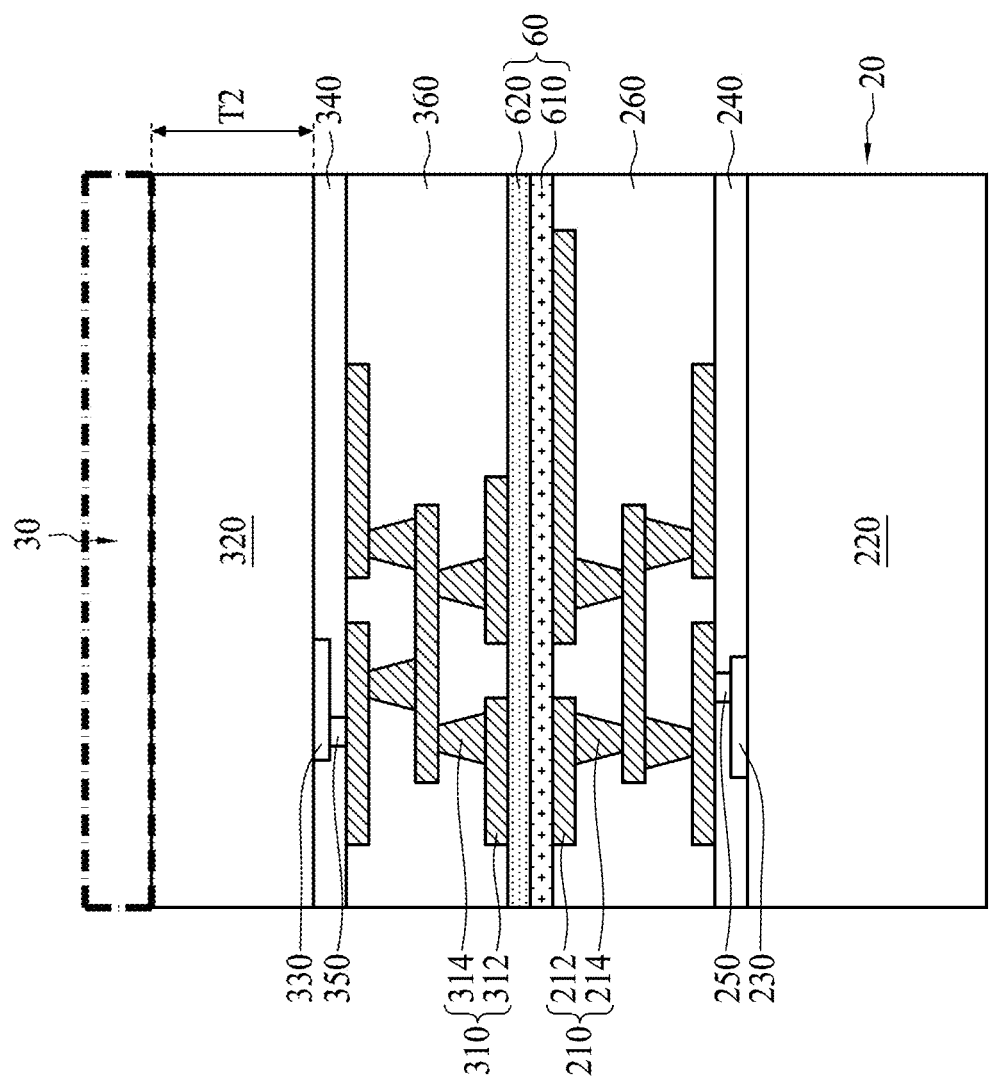

Referring to FIG. 8, in some embodiments, a thinning process is performed to thin the second substrate 320' according to a step S710 in FIG. 2. In some embodiments, the second substrate 320' is thinned to a thickness T2, which is about 50 micrometers. The second substrate 320' is thinned to reduce processing time for forming the interconnect structure, as described below. In FIG. 8, the dotted line marks an original thickness of the second substrate 320'. The thinning process may be implemented using suitable technique such as a grinding process, a polishing process and/or a chemical etching process.

Figure 9:
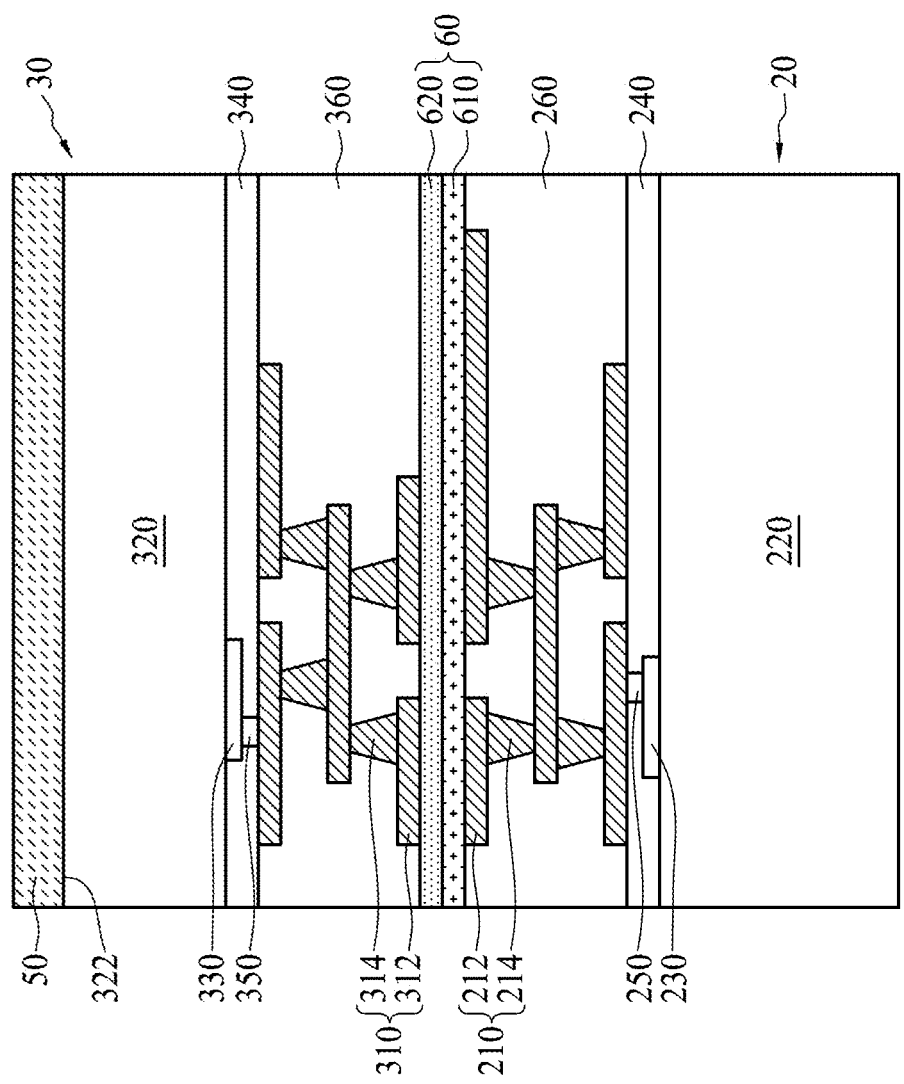

Referring to FIG. 9, a cap dielectric layer 50 is deposited on the second substrate 320 according to a step S711 in FIG. 2. In some embodiments, the cap dielectric layer 50 covers a back surface 322 of the second substrate 320. In some embodiments, the method of forming the cap dielectric layer 50 can include a CVD process, a spin coating process, or other suitable process that can form a dielectric material. In some embodiments, the cap dielectric layer 50 may include oxide, such as silicon oxide.

Figure 10A:
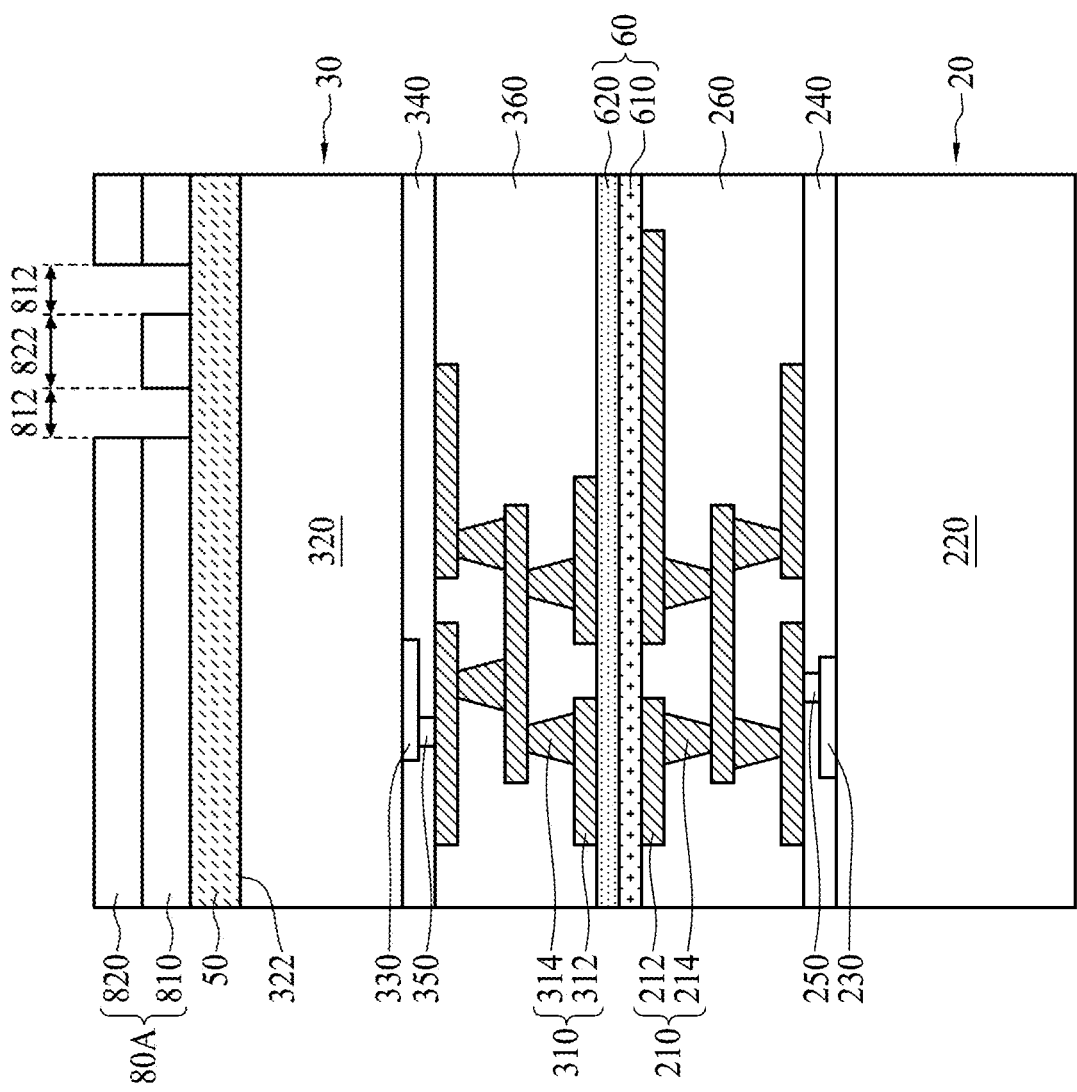
FIG. 10A is cross-sectional view of intermediate stages in the formation of a semiconductor assembly in accordance with some embodiments of the present disclosure.
Figure 10B:
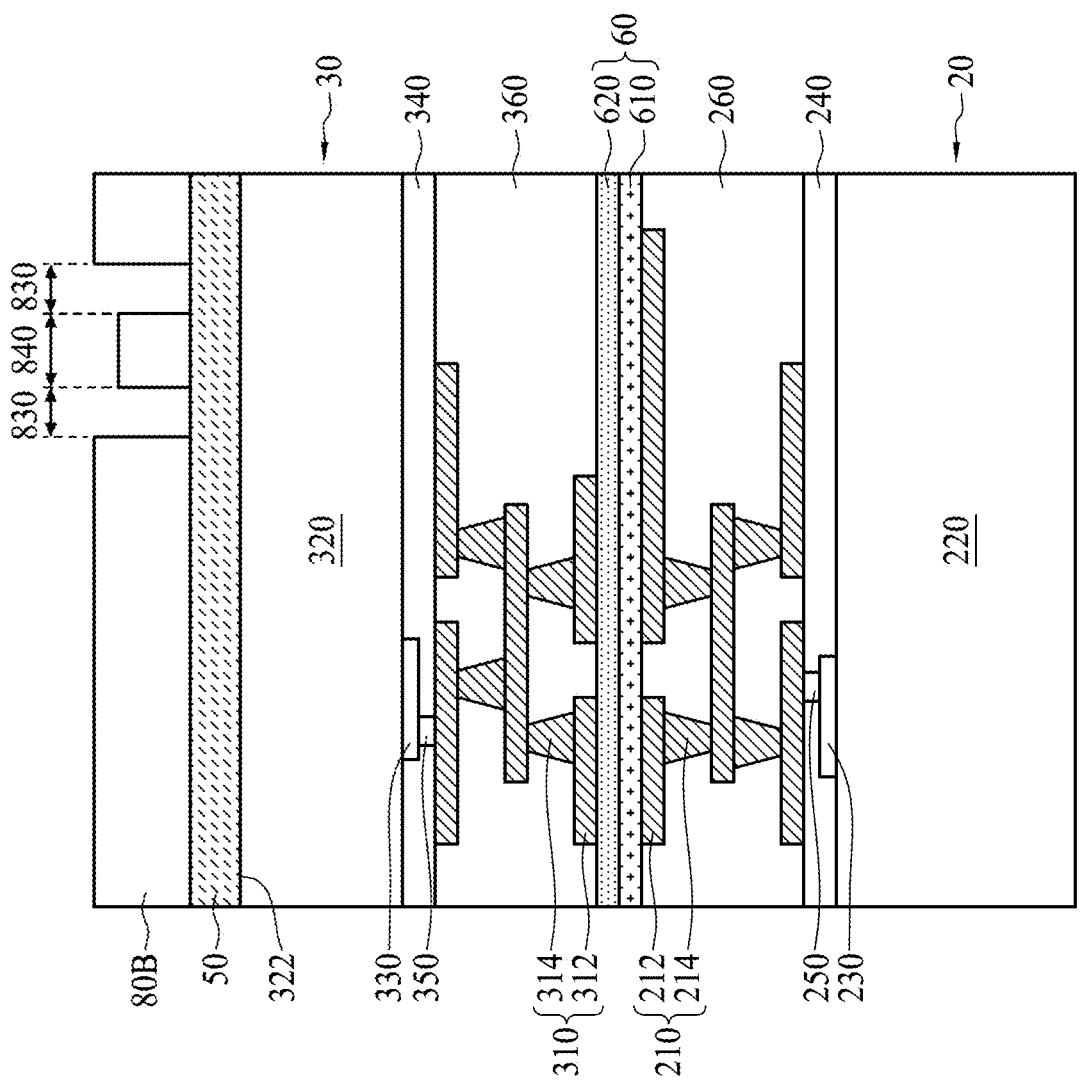
FIG. 10B is cross-sectional view of intermediate stages in the formation of a semiconductor assembly in accordance with some embodiments of the present disclosure.
Figure 11:
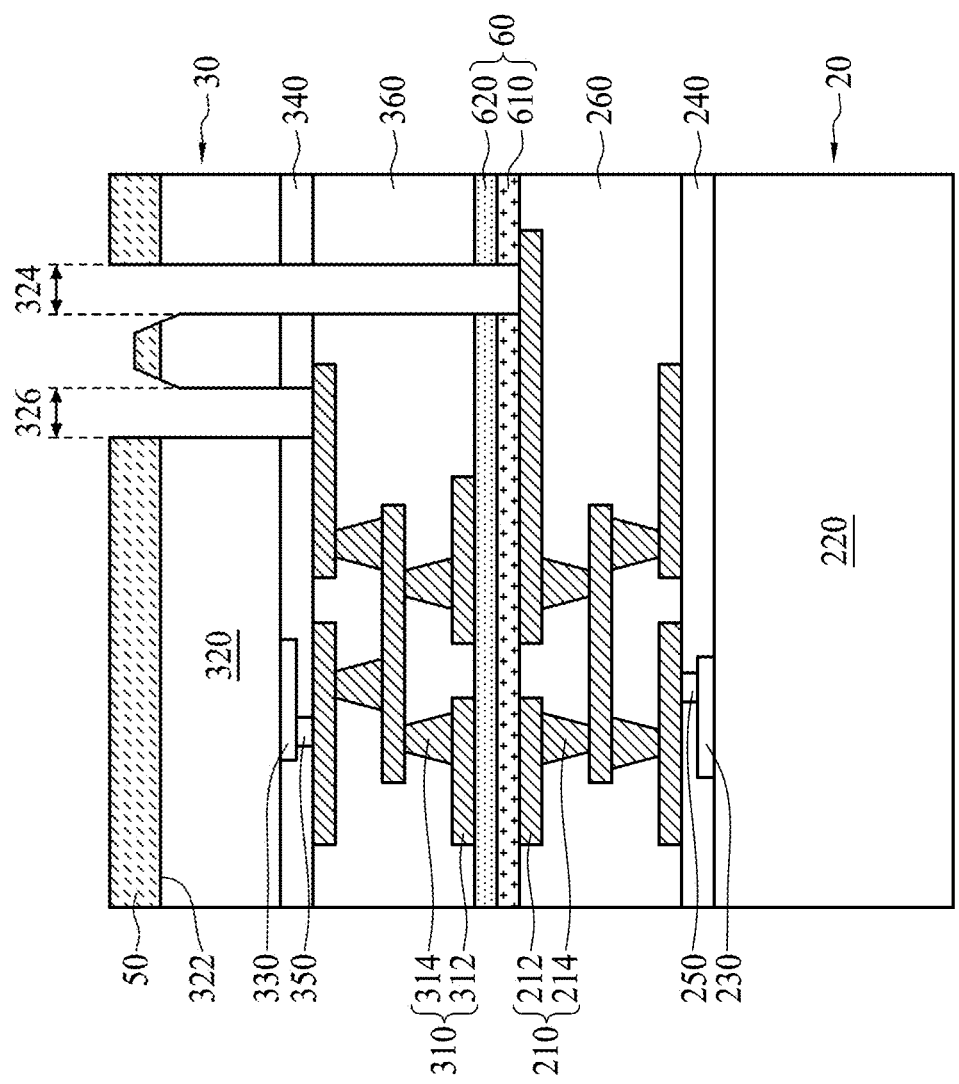
FIGS. 11 through 13 are cross-sectional views of intermediate stages in the formation of a semiconductor assembly in accordance with some embodiments of the present disclosure.

Referring to FIGS. 10A, 10B and 11, in some embodiments, a first trench 324 is formed through the second device 30 and the bonding layer 60, and a second trench 326 is formed in the second device 30 according to a step S712 in FIG. 2. The first trench 324 and the second trench 326 are formed by providing an etching mask 80A/80B on the cap dielectric layer 50, and performing at least one etching process to remove portions of the second substrate 320, the second insulating layer 340, the second ILD layer 360, and the bonding layer 60.

As shown in FIG. 10A, the etching mask 80A has a stepped profile. Specifically, the etching mask 80A includes a first layer structure 810 and a second layer structure 820, wherein the first layer structure 810 is disposed between the cap dielectric layer 50 and the second layer structure 820. In some embodiments, the fabrication of the first layer structure 810 involves sequentially coating a blanket first layer on the cap insulating layer 50, and patterning the first layer to form a plurality of first openings 812 in the first layer, wherein portions of the cap dielectric layer 50 are exposed through the first openings 812. The fabrication of the second layer structure 820 involves sequentially depositing a blanket second layer on the first layer structure 810 and filling the first openings 812, and patterning the second layer to recreate the first openings 812 and remove portions of the second layer between the first openings 812; accordingly, at least one second opening 822 is formed and communicates with the first openings 812. In some embodiments, the first main component 230, the first conductive plug 250, the second main component 330 and the second conductive plug 350 are disposed in areas other than the areas beneath the first openings 812 and the second opening 822.

After the forming of the second layer structure 820, the etching process performed. In some embodiments, the etching process can utilize multiple etchants to etch the cap dielectric layer 50, the second substrate 320, the second insulating layer 340, the second ILD layer 360, and the bonding layer 60, wherein the etchants are selected based on the materials being etched. After the etching process is performed, at least one portion of the first conductive feature 210 is exposed through the first trench 324, and at least one portion of the second conductive feature 310 is exposed through the second trench 326. In some embodiments, portions of the first layer structure 810 not covered by the second layer structure 820 are removed during the etching process, and portions of the cap dielectric layer 50 and the second substrate 320 are eroded, as shown in FIG. 11. In some embodiments, the cap dielectric layer 50, the second device 30 and the bonding layer 60 may be etched using a dry etching process, an anisotropic wet etching process, or any other suitable anisotropic etching process. After the performing of the etching process, the etching mask 80A is removed, for example, by an ashing process or a wet strip process.

Referring to FIG. 10B, the etching mask 80B is a single-layered structure having a plurality of through holes 830 and a blind holes 840 in communication with the through holes 830. In some embodiments, blind hole 840 is disposed between the through holes 830. The etching mask 80B includes, for example, a photoresist material and is formed by performing a lithographic process on the photoresist material fully covering the cap insulating layer 50. In some embodiments, the lithographic process typically involves exposure to (ultraviolet/deep ultraviolet) lights, followed by subsequent baking, inducing a photochemical reaction which changes the solubility of the exposed regions of the photoresist material. Thereafter, an appropriate developer, typically an aqueous base solution, is used to selectively remove the photoresist material in the exposed regions (for positive-tone resists). In some embodiments, by adjusting the illumination intensities of the lights and the exposure times on the different portions of the photoresist material, the etching mask 80B having a predetermined profile for patterning the second device 30 and the bonding layer 60 can be formed. After the formation of the etching mask 80B, the etching process is performed to create the first trench 324 and the second trench 326.

Figure 12:
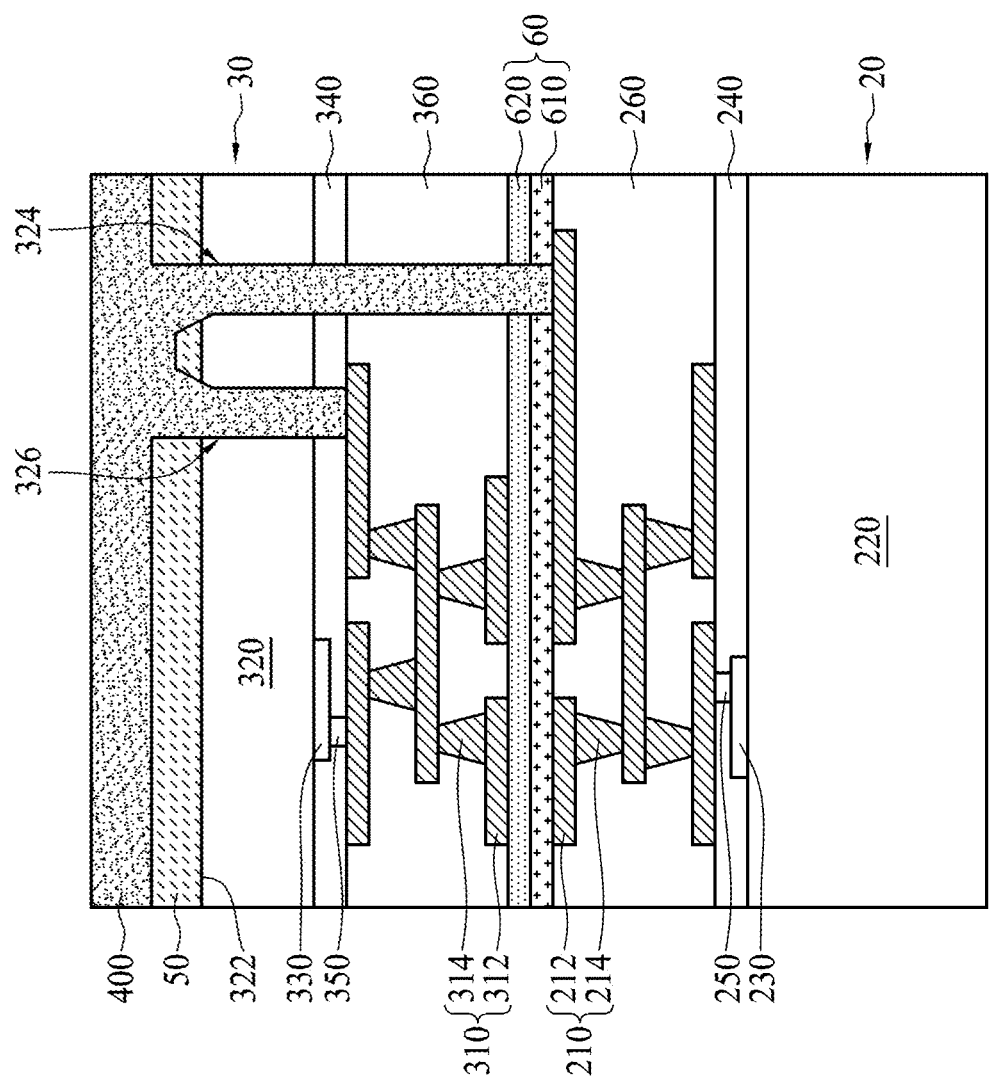

Referring to FIG. 12, in some embodiments, a second conductive material 400 is deposited in the first trench 324 and the second trench 326 according to a step S714 in FIG. 2. In some embodiments, the second conductive material 400 not only fills up the first trench 324 and the second trench 326 but also covers the cap dielectric layer 50. In some embodiments, the second conductive material 400 is formed using a plating process. In some embodiments, if the second conductive material is a copper-containing material, which is easy to diffuse, a diffusion barrier layer (not shown) and/or a seed layer (not shown) may be formed, for example, using a physical vapor deposition (PVD) process, a CVD process, or the like on the cap dielectric layer 50 and in the first trench 324 and the second trench 326 prior to the deposition of the second conductive material 400.

Figure 13:
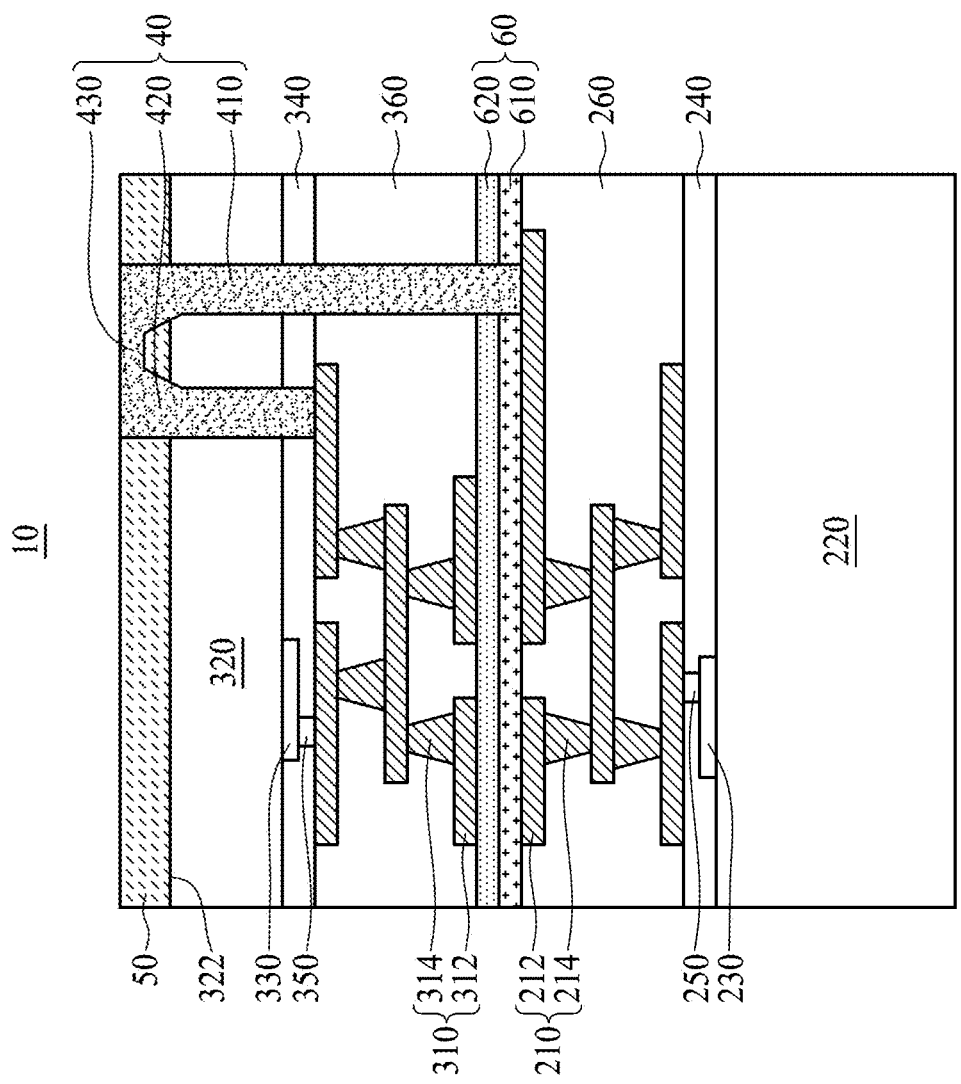

Referring to FIG. 13, in some embodiments, a polishing process is performed to expose the cap dielectric layer 50 and thus form an interconnect structure 40 according to a step S716 in FIG. 2. Accordingly, the semiconductor assembly 10 is completely formed. As shown in FIG. 13, the interconnect structure 40 includes a first leg 410 contacting the first conductive feature 210, a second leg 420 contacting the second conductive feature 310, and a cross member 430 connecting the first leg 410 to the second leg 420. Specifically, the first leg 410 penetrates through the cap dielectric layer 50, the second substrate 320, the second insulating layer 340, the second ILD layer 360 and the bonding layer 60 and contacts the first conductive feature 210 farthest from the first substrate 220; the second leg 420 penetrates through the cap dielectric layer 50, the second substrate 320 and the second insulating layer 340 and contacts the second conductive feature 310 closest to the second substrate 320.

One aspect of the present disclosure provides a semiconductor assembly. The semiconductor assembly includes a first device, a second device, a cap dielectric layer and an interconnect structure. The second device is stacked on and bonded to the first device, and the cap dielectric layer is disposed on the second device. The interconnect structure includes a first leg penetrating through the cap dielectric layer and the second device and contacting a first conductive feature of the first device, a second leg penetrating through the cap dielectric layer and contacting a second conductive feature of the second device, and a cross member connecting the first leg to the second leg.

One aspect of the present disclosure provides a method of manufacturing a semiconductor assembly. The method includes steps of providing a first device and forming a first bonding layer on the first device; providing a second device and forming a second bonding layer on the second device; stacking the second device on the first device such that the second device contacts the first bonding layer and the second bonding layer; fusing the first bonding layer and the second bonding layer; depositing a cap dielectric layer on the second device; forming an interconnect structure to electrically connect the second device to the first device.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods and steps.

What is claimed is:

1. A method of manufacturing a semiconductor assembly, comprising:
   providing a first device and forming a first bonding layer on the first device;
   providing a second device and forming a second bonding layer on the second device;
   stacking the second device on the first device and bringing the first bonding layer into contact with the second bonding layer;
   fusing the first bonding layer and the second bonding layer;
   depositing a cap dielectric layer on the second device;
   forming an interconnect structure to electrically connect the second device to the first device, wherein forming of the interconnect structure comprises:
      forming a first trench through the cap dielectric layer, the second device, the second bonding layer and the first bonding layer to expose a first conductive feature of the first device;
      forming a second trench in the second device to expose a second conductive feature of the second device simultaneously with the forming of the first device; and
      depositing a conductive material in the first trench and the second trench; wherein a portion of the cap dielectric layer between the first trench and the second trench is removed simultaneously with the forming of the first trench and the second trench, and the conductive material is further deposited on the cap dielectric layer between the first trench and the second trench.

2. The method of claim 1, wherein the first bonding layer contacts the first conductive feature, and the second bonding layer contacts the second conductive feature.

3. The method of claim 1, wherein the forming of the first trench and the second trench comprises:
 forming a first layer structure on the cap dielectric layer, wherein the first layer structure comprises a plurality of first openings to expose portions of the cap dielectric layer;
 forming a second layer structure to cover portions of the first layer structure, wherein the first openings are exposed through the second layer structure; and
 performing an etching process to form the first trench and the second trench, and removing the portion of the cap dielectric layer through the first layer structure not covered by the second layer structure.

4. The method of claim 1,
 wherein the first device comprises a first substrate, a first main component on the first substrate, a first insulating layer covering the first substrate and encapsulating the first main component, a first conductive plug in the first insulating layer and connecting the first main component to the first conductive feature, and a first ILD layer surrounding the first conductive feature;
 wherein the second device comprises a second substrate, a second main component on the second substrate, a second insulating layer covering the second substrate and encapsulating the second main component, a second conductive plug in the second insulating layer and connecting the second main component to the second conductive feature, and a second ILD layer surrounding the second conductive feature, wherein the cap dielectric layer contacts the second substrate; and wherein the first trench penetrates through the second substrate, the second insulating layer and the second ILD layer, and the second trench penetrates through the second substrate and the second insulating layer.

5. The method of claim 4,
 wherein the first conductive feature comprises a plurality of first horizontal members and a plurality of first vertical members alternately stacked, and the first horizontal members farthest from the first substrate contact the first bonding layer; and
 wherein the second conductive feature comprises a plurality of second horizontal members and a plurality of second vertical members alternately stacked, and the second horizontal members farthest from the second substrate contact the second bonding layer.

6. The method of claim 1, further comprising thinning the second device before the deposition of the cap dielectric layer.

7. The method of claim 1, wherein an anneal process is performed to fuse the first bonding layer and the second bonding layer so as to strengthen the bond between the first bonding layer and the second bonding layer.

* * * * *